United States Patent
Jones

(10) Patent No.: US 10,224,312 B1
(45) Date of Patent: Mar. 5, 2019

(54) VIA CONFIGURATION FOR WAFER-TO-WAFER INTERCONNECTION

(71) Applicant: National Technology & Engineering Solutions of Sandia, LLC, Albuquerque, NM (US)

(72) Inventor: Adam Jones, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 3 days.

(21) Appl. No.: 15/603,100

(22) Filed: May 23, 2017

(51) Int. Cl.
| | |
|---|---|
| *H01L 23/48* | (2006.01) |
| *H01L 23/52* | (2006.01) |
| *H01L 29/40* | (2006.01) |
| *H01L 25/065* | (2006.01) |
| *H01L 23/00* | (2006.01) |
| *H01L 25/00* | (2006.01) |

(52) U.S. Cl.
CPC .......... *H01L 25/0657* (2013.01); *H01L 24/13* (2013.01); *H01L 24/16* (2013.01); *H01L 25/50* (2013.01); *H01L 2224/13006* (2013.01); *H01L 2224/13014* (2013.01); *H01L 2224/13082* (2013.01); *H01L 2224/16145* (2013.01); *H01L 2225/06513* (2013.01); *H01L 2225/06527* (2013.01); *H01L 2225/06568* (2013.01)

(58) Field of Classification Search
CPC . H01L 2924/00014; H01L 2224/05624; H01L 2224/05647; H01L 2224/0401; H01L 2224/05555; H01L 2224/05684; H01L 2224/13099; H01L 2225/06513; H01L 2225/06527; H01L 2225/06541; H01L 23/5252

See application file for complete search history.

(56) References Cited

U.S. PATENT DOCUMENTS

| | | |
|---|---|---|
| 6,037,547 A | 3/2000 | Blish, II |
| 7,984,389 B2 | 7/2011 | Rusu et al. |
| 8,972,899 B2 | 3/2015 | Carlsson et al. |
| 9,190,392 B1 | 11/2015 | Shinde et al. |

(Continued)

OTHER PUBLICATIONS

Liu, F. et al., "A 300-mm Wafer-Level Three-Dimensional Integration Scheme Using Tungsten Through-Silicon Via and Hybrid Cu-Adhesive Bonding", Electron Device Meeting, IEDM 2008. IEEE International, Dec. 15-17, 2008.

*Primary Examiner* — Meiya Li
(74) *Attorney, Agent, or Firm* — Capitol Patent & Trademark Law Firm, PLLC; Mark A. Dodd

(57) ABSTRACT

A modification to the standard layout of vias used for vertically-stacked wafer bonding is proposed which has been found to improve the interconnect overlay while avoiding the dishing problems associated with the planarization processes used in the creation of conductive posts within the vias. In particular, the pitch, i.e. the spacing between adjacent posts, is intentionally chosen to be different for each wafer. By using different pitches, there is an increase in the probability of overlap of posts on each wafer, even when one wafer is slightly offset with respect to the other (which is possible when aligning one wafer with another in a standard bonding tool). Advantageously, the use of different pitches allows for the use of relatively small diameter (one micron or less) posts while still creating sufficient overlap for the necessary connections.

21 Claims, 3 Drawing Sheets

(56) References Cited

U.S. PATENT DOCUMENTS

| | | | |
|---|---|---|---|
| 9,306,116 | B2 | 4/2016 | El-Ghoroury et al. |
| 9,331,048 | B2 | 5/2016 | Zou et al. |
| 9,379,078 | B2 | 6/2016 | Yu et al. |
| 9,536,809 | B2 | 1/2017 | Batra et al. |
| 2008/0122100 | A1 | 5/2008 | Tsao et al. |
| 2009/0111241 | A1 | 4/2009 | Lee |
| 2010/0270676 | A1* | 10/2010 | Chang ............ H01L 24/06 257/773 |
| 2011/0175905 | A1 | 7/2011 | Hao |
| 2011/0289207 | A1 | 11/2011 | Liu et al. |
| 2016/0172268 | A1 | 6/2016 | Katkar et al. |

\* cited by examiner

VIA CONFIGURATION FOR WAFER-TO-WAFER INTERCONNECTION

STATEMENT OF GOVERNMENT INTEREST

This invention was made with Government support under Contract No. DE-NA0003525 awarded by the United States Department of Energy/National Nuclear Security Administration. The Government has certain rights in the invention.

BACKGROUND

As packaging density in semiconductor devices continues to increase, three-dimensional (3D) wafer-to-wafer stacking has become a viable solution for accommodating an increased number of devices within a specific "footprint" (surface area) of a given package. 3D wafer stacking technology offers a number of potential benefits, including, for example, improved form factors, lower costs, enhanced performance, as well as greater integration through system-on-chip (SoC) solutions. In addition, the 3D technology may provide other functionality to the chip.

One factor in achieving manufacturable and cost-effective 3D wafer configurations relates to providing reliable and repeatable electrical bonding between wafers within the stack. An exemplary approach for providing wafer-to-wafer bonding is defined as "direct bonding", which can be thought of as using conventional wafer fabrication techniques (including wafer thinning, photolithography masking, via etching and interconnect metallization) to create bond pad areas ("posts") on each wafer. The wafers are then disposed one on top of another such that the posts face each other. Presuming the posts are properly aligned, the wafers are bonded together, forming both physical attachment and electrical signal path connection between the wafers.

One critical parameter in the direct bond interface (DBI) process is the flatness that can be obtained on an exposed top surface of the wafer within which the metal posts are formed. After the metal is deposited in the vias formed in the wafer, a planarization process is used to even out the upper surface of the wafer and expose a planar array of post surfaces. In most cases, a chemical mechanical polishing (CMP) operation is used to perform this planarization. It is well known, however, that "dishing" (removal of metal below the final surface of the structure) occurs during CMP and is directly proportional to the diameter of the post. That is, the larger the diameter of the post, the wider and deeper the dishing that may result. Obviously, if the dishing is too severe, electrical connection between mating posts is compromised.

While decreasing the diameter of the posts is a reasonable solution to overcome the dishing problem, the use of small diameter posts impacts the ability of conventional wafer bonding tools to align one wafer with another when forming the vertical wafer stack. In other words, the overlay accuracy of the bonding tool ultimately determines the reliability and repeatability of the DBI process.

SUMMARY

One aspect of the present invention relates to a modification to the standard layout of vias used in the mutual bonding of vertically stacked wafers (or integrated circuit die), in order to improve the interconnect overlay while avoiding the dishing problems associated with CMP. The vias formed on each wafer (or die) are separated by a pitch defined for that wafer (die), where the pitches are preferably related by a pitch factor N so that overlap between vias of joining wafers will occur with a given periodicity. The use of different (but related) pitches thus de-couples the overlay problem associated with using small diameter (i.e., sub-micron) vias from the tolerances of conventional bonding tools.

In one embodiment, relatively small diameter posts may be used as bonding sites on each wafer (e.g., diameter on the order of one micron, perhaps less). The use of relatively small posts is less likely to be affected by dishing during a CMP process. In accordance with the present invention, the spacing between adjacent posts (defined as the "pitch") is intentionally chosen to be different for each wafer. This is in contrast to the prior art, which uses the same pitch spacing on each wafer being bonded. By using different pitches, there is an increase in the probability of overlap of posts on each wafer, even when one wafer is slightly offset with respect to the other (which is possible when aligning one wafer with another in a standard bonding tool).

In one exemplary configuration, the pitches can be related through a function of some integer N, that is, the pitches are inversely proportional to a specific value based on N. In one case, the pitch of posts on a first wafer may be scaled by a value of (N+1) and the pitch of the posts on a second, joining wafer may be scaled by an incrementally different value of (N−1). By relating the two pitches through this common pitch factor N, there will inevitably be one or more locations where overlap between the two sets of posts will occur, provided the minimum diameter D of the posts is at least $2P_0/(N^2-1)$, where $P_0$ is a nominal pitch value. More generally, $P_{bot}$ and $P_{top}$ can be related by (N+x), (N−x), where the step value x is greater than zero but less than N. Often, a unit step value of x=1 may be preferred for ease of fabrication.

One particular embodiment of the present invention can be defined as a vertically stacked integrated circuit assembly comprising a first integrated circuit substrate including a first plurality of bond posts, with adjacent bond posts separated by a predetermined first pitch $P_{bot}$, and a second integrated circuit substrate including a second plurality of bond posts, with adjacent bond posts of the second plurality of bond posts separated by a predetermined second pitch $P_{top}$, where $P_{top} \neq P_{bot}$. Thus, when the first and second integrated circuit substrates are vertically arranged, the second plurality of bond posts overlaps at least a portion of the first plurality of bond posts. A bond is then utilized to electrically and physically connect the overlapped portions of the first plurality of bond posts and the second plurality of bond posts.

Another particular embodiment of the present invention may take the form of a method of forming an integrated circuit assembly, comprising disposing a first substrate having a first plurality of posts having a first pitch $P_{top}$ over a second substrate having a second plurality of posts having a second pitch $P_{bot}$, aligning the first and second substrates such that the second plurality of bond posts overlaps at least a portion of the first plurality of bond posts, and attaching the first substrate to the second substrate by bonding the overlapped portions of the first plurality of bond posts with the second plurality of bond posts.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION, WITH EXAMPLES

As will be discussed in detail below, the techniques of the present invention relate to using small-diameter posts for attaching vertically-stacked wafers in a direct bond interconnect (DBI) structure. The posts may be formed to have a diameter on the order of one micron (or less), minimizing dishing problems that arise when polishing or otherwise planarizing a wafer surface after filling the vias with a conductive material (for example, copper). Conventional, larger-sized posts (typically on the order of 10 microns or so), may exhibit areas where too much surface material is removed during planarization, thus impacting the quality of the electrical connection thereafter formed with posts on an overlying wafer.

Inasmuch as typical wafer bonding tools are not equipped to provide micron-level alignment, the use of small-diameter posts has heretofore not been an option. However, it is now determined in accordance with the teachings of the present invention that by using different inter-post spacings (pitch) on each wafer, the ability to guarantee a certain degree of overlap between posts on each wafer is increased. The amount of overlap is provided by using different (but related) pitches for each wafer, thus ensuring that a sufficient electrical connection and physical bond is formed between via arrays on each wafer. Although the following discussion is related to one or more embodiments where a first wafer is bonded to a second wafer, it is to be understood that the principles of the present invention relate generally to electrical interconnections between any two integrated circuit "substrates". The term "substrate" in this regard includes die, wafers and substrates associated with integrated circuit formation, including "interposer" substrates that are used as an interconnection elements between pairs of circuit-populated substrates or wafers.

Figure 1:
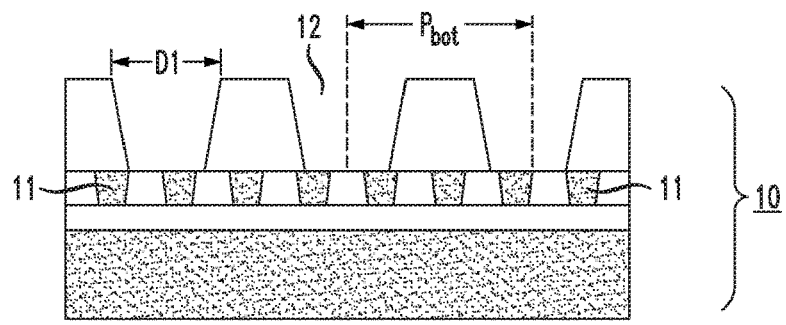
FIG. 1 illustrates an exemplary semiconductor wafer fabricated to include a plurality of vias etched through the top surface of the wafer, the fabrication process controlled to define a predetermined diameter for the vias, with a predetermined pitch $P_{bot}$ between adjacent vias.
Figure 2:
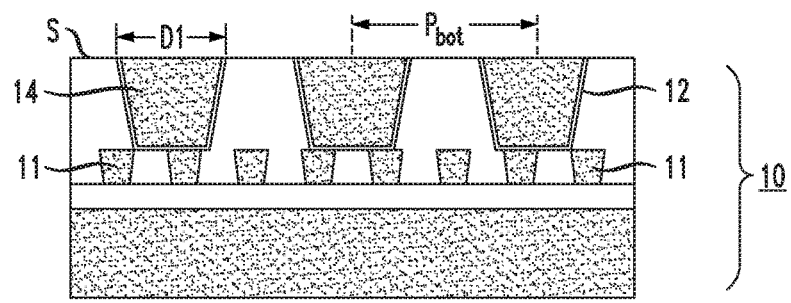
FIG. 2 illustrates the wafer of FIG. 1, subsequent to a set of processing steps used to fill the vias with conductive material and planarize the structure, so as to form a plurality of conductive posts, each post of the same predetermined diameter $D_1$ and exhibiting the predetermined pitch $P_{bot}$.

FIG. 1 illustrates an exemplary wafer 10 formed to include a plurality of etched vias 12, where vias 12 are utilized to provide an electrical conduction path to metal contacts 11 formed within wafer 10. Well-known fabrication techniques are used to pattern the surface of wafer 10 and create vias 12, where in accordance with the present invention the patterning is used to define both the diameter $D_1$ of the vias and a predetermined pitch $P_{bot}$ between the centers of adjacent vias. A following step in the process of creating a direct bond interface (DBI) structure is to fill vias 12 with a conductive material. FIG. 2 illustrates wafer 10 after this step, where vias 12 have been filled with a conductive material (e.g., copper) to form a plurality of conductive posts 14. Posts 14 are shown as also being spaced by the predetermined pitch $P_{bot}$.

In accordance with various exemplary embodiments of the present invention, each post 14 is formed to have a relatively small diameter $D_1$, typically on the order of one micron (or even less). Thus, during a post-fill step of planarizing surface S of wafer 10, the integrity of the surface of each post is maintained. This is in contrast to prior art DBI configurations that use posts having a diameter on the order of 10 microns, where these larger exposed copper surfaces have been known to be subjected to over-processing (i.e., "dishing") during planarization processes. It is to be understood, however, that the inventive use of multiple pitches in arranging via arrays is not limited to implementations with small diameter vias and, in fact, may be used in configurations with vias of any given diameter.

Figure 3:
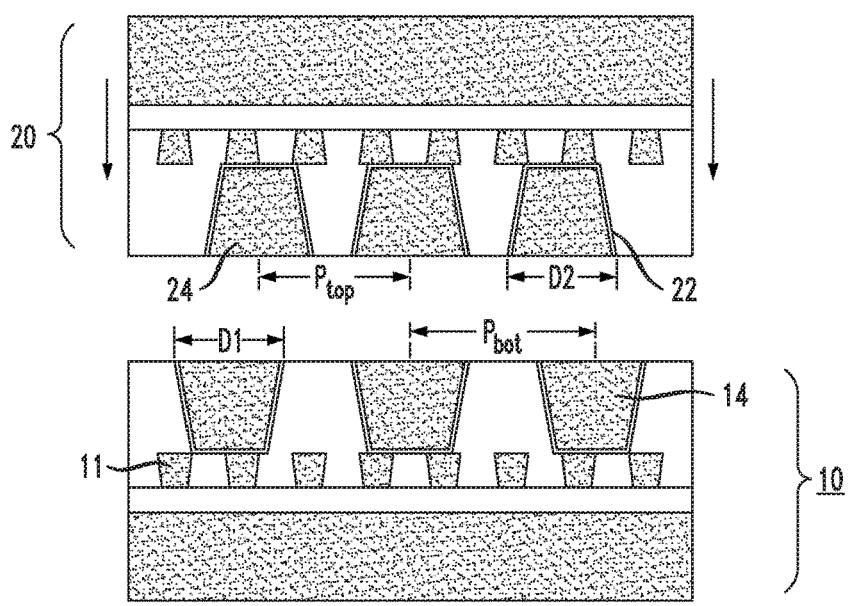
FIG. 3 illustrates in simplified form a direct bond interface configuration for joining a second wafer ("top wafer") to the bottom wafer as shown in FIG. 2, where the top wafer is formed to include a plurality of conductive posts of the same diameter as the posts on the bottom wafer, but separated by a different pitch spacing.

FIG. 3 illustrates a next step in providing DBI between a pair of wafers. Here, a second wafer 20 (referred to at times hereafter as a "top" wafer) is disposed over and attached to bottom wafer 10. It is to be understood that the terms "top", "bottom", "over", "under" are used only for the sake of convenience in explaining an embodiment of the present invention and are not intended to limit any specific orientation or placement of the various elements.

Continuing with the description of the elements in FIG. 3, second wafer 20 is shown as processed in a manner similar to wafer 10, where a plurality of vias 22 has been etched in wafer 20. A conductive material (e.g., copper) is later deposited to fill vias 22 and form bond posts 24. In accordance with the present invention, and discussed in detail below, vias 22 (and, therefore, posts 24) are formed to exhibit a different pitch than that associated with wafer 10. In particular, FIG. 3 shows a pitch $P_{top}$ between adjacent posts 24. Both vias 22 and posts 24 are preferably formed to exhibit a diameter $D_2$ that is essentially equal to the diameter $D_1$ exhibited by vias 12 and bond posts 14 (where "essentially equal" is used in this case to mean "equal to within 10% to allow for manufacturing tolerances").

In providing post-to-post attachment, second wafer 20 is positioned so that the plurality of posts 24 are disposed over (for example), and attached to, posts 14 formed within the top surface of first wafer 10. As will be discussed in detail below, by virtue of using different (but related) pitches $P_{bot}$ and $P_{top}$ in combination with posts of essentially equal diameters $D_1$ and $D_2$, the likelihood for alignment between posts 14 and posts 24 is increased, even with the inaccuracies in alignment that are encountered when using conventional bonding tools to attach wafer 20 to wafer 10. The use of these different pitches allows for small diameter vias to be utilized, thus de-coupling the problem of overlaying "small" vias from the given alignment tolerance limitations of conventional bonding tools.

More particularly, an exemplary embodiment of the present invention is based upon defining a pitch factor N that is used to define the relationship between $P_{bot}$ and $P_{top}$, where the pitch factor N can be thought of as a "shrinkage" factor to be applied against a conventional pitch factor. That is, for a given pitch factor N and a nominal (conventional and predefined) pitch $P_0$, a difference in pitch useful in achieving sufficient overlay can be defined as follows:

$$P_{top} = \frac{P_0}{(N+1)}, \text{ and}$$

$$P_{bot} = \frac{P_0}{(N-1)},$$

where in this example the pitch for each via array is stepped "one" unit from the pitch factor (i.e., either "up" or "down" from the pitch factor N). With respect to prior art configurations, a "nominal" pitch $P_0$ of 20 μm can be considered as typical, used with bond posts having a diameter on the order of 10 μm.

Continuing, the above relation can be rewritten as follows:

$$P_{top} = \left(\frac{N-1}{N+1}\right) P_{bot},$$

where it is to be understood that the increment of "one up, one down" is exemplary only, and the relation between $P_{top}$ and $P_{bot}$ can be generally expressed as follows:

$$P_{top} = \left(\frac{N-x}{N+x}\right) P_{bot},$$

where x is defined as the "pitch step" and may be any positive non-zero value less than N. Indeed, x may be a non-integer value (say, 0.5), where in this case the relationship between $P_{top}$ and $P_{bot}$ would be "half up, half down". In another case, x may be somewhat larger than unity, say a value of 5 or 10, as limited, e.g., by the capabilities of the fabrication equipment used to pattern the vias and form the bond posts.

Figure 4:
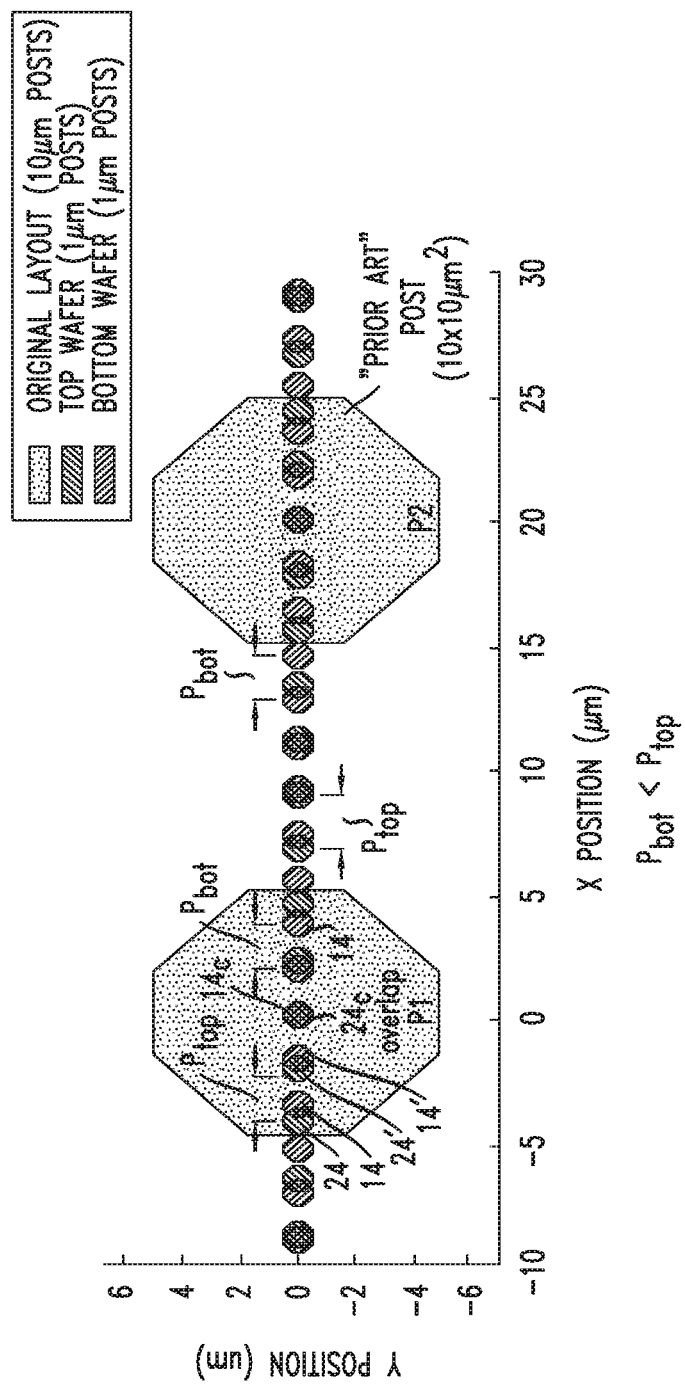
FIG. 4 is a diagram illustrating an overlap of posts from a pair of vertically stacked wafers ("top" and "bottom" wafers), showing the different pitches for the posts on the bottom wafer and the posts on the top wafer, in this case with the sets of posts disposed linearly along a defined x direction.

FIG. 4 is a diagram of an exemplary layout of vias (or posts) in a linear array form, showing posts 14 (from first wafer 10) and posts 24 (from second wafer 20). In the figure, posts 24 are seen to "overlay" posts 14 when second wafer 20 is positioned over first wafer 10. In this particular illustration, posts 14 and 24 are of relatively small diameter (with the diameter of posts 14 being essentially equal to the diameter of posts 24) and for the sake of comparison a pair of prior art large-sized posts P1, P2 are shown as well. (Posts P1, P2 are conventionally formed to extend about 10 microns in both the x and y directions.) The pitch (i.e., separation) between adjacent posts 14, $P_{bot}$, is shown in this view, as well as pitch $P_{top}$ associated with posts 24. As shown in FIG. 4, posts 14 and 24 extend along the entire extent of the bonding surface in the x-direction. Inasmuch as a planarization process is utilized to prepare the final surface of the wafer (including the plurality of posts), it is desirable to utilize a layout of posts across the entire extent of the wafer to prevent "local" non-uniformities from interrupting the planarization process.

In this diagram, it is presumed that the center posts $14_c$ and $24_c$ completely overlap each other. As the posts are each spaced by their respective pitches, the overlap between neighboring posts is also shown. In the diagram of FIG. 4, vias 14' and 24' (to the left of $14_c$, $24_c$), are shown to include overlapped portions. A similar overlapped portion is shown for posts 14", 24".

If it is presumed that center post $14_c$ on wafer 10 is aligned with center post $24_c$ on wafer 20, the nearest neighbors from the center posts are thus offset by:

$$\Delta = \frac{2P_0}{(N^2-1)},$$

where $P_0$ is defined as a nominal pitch value used in determining $P_{bot}$ and $P_{top}$ (thus in the present example, $P_{bot}=P_0/(N-1)$, $P_{top}=P_0/(N+1)$). In accordance with the present invention, as long as the diameters $D_1$ and $D_2$ of posts 14, and 24, respectively, are greater than or equal to $\Delta$, any shift of top wafer 20 with respect to bottom wafer 10 will result in at least one electrical connection between posts being maintained.

In one exemplary configuration formed in accordance with an embodiment of the present invention, the post diameters $D_1$ and $D_2$ (for the posts on wafer 10 and wafer 20, respectively) are both selected to be 1.0 μm, with $P_{bot}=1.8$ μm and $P_{top}=2.2$ μm. In this case, simple geometrical arguments show that for any overlay offset between bottom wafer 10 and top wafer 20, the overlap for at least one pair posts cannot be less than ($D_1$ (or $D_2$)–$\Delta/2$), which in this case provides a minimum overlap of 0.8 μm, yielding excellent contact regardless of bond overlay.

In one exemplary configuration formed in accordance with an embodiment of the present invention, the post diameter D (for the posts on each wafer) is selected to be 1.0 μm, with $P_{bot}=1.8$ μm and $P_{top}=2.2$ μm. In this case, simple geometrical arguments show that for any overlay offset between bottom wafer 10 and top wafer 20, the overlap for at least one pair posts cannot be less than (D–$\Delta/2$), which in this case provides a minimum overlap of 0.8 μm, yielding excellent contact regardless of bond overlay.

Figure 5:
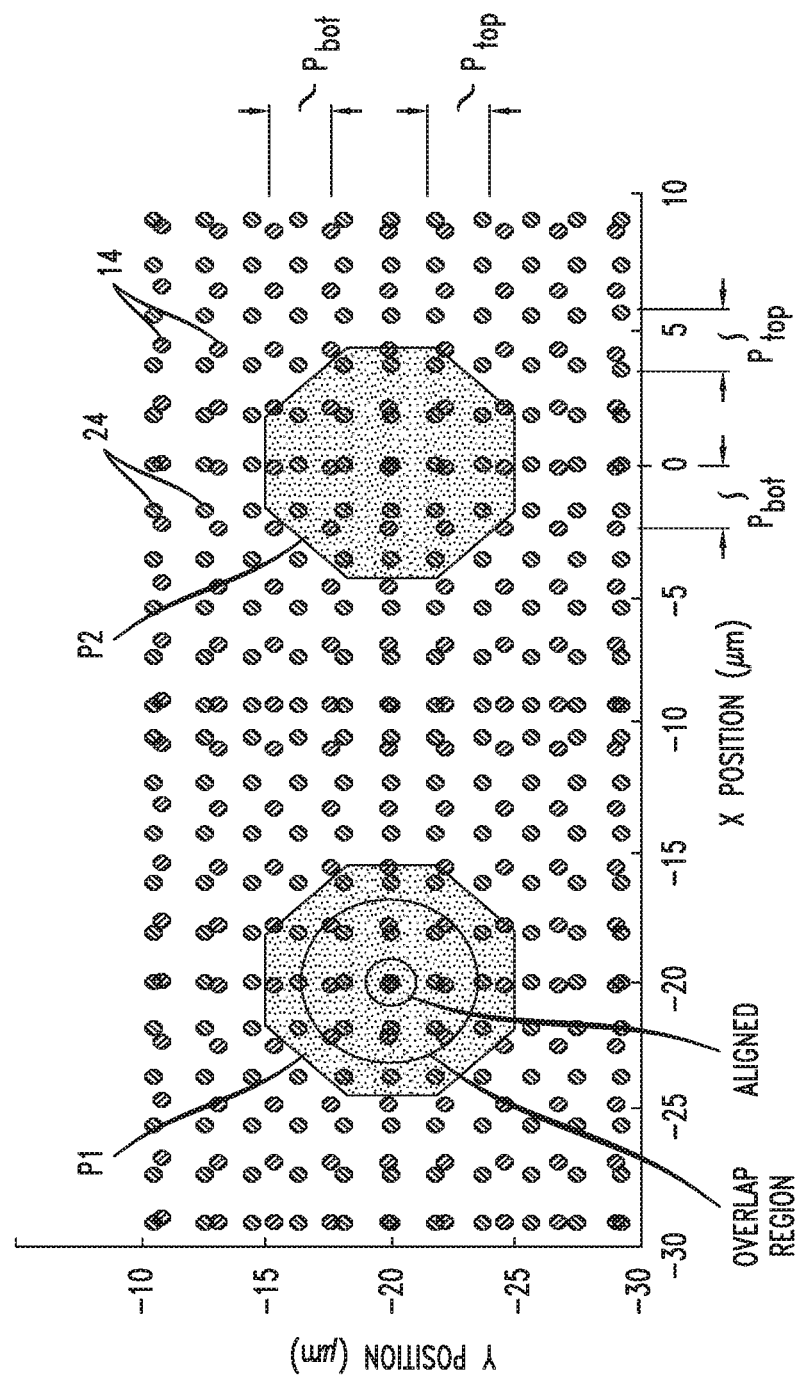
FIG. 5 is a diagram similar to that of FIG. 4, in this case showing a two-dimensional (x-y) array of posts formed on each of the top and bottom wafers.

It is to be understood that the use of different pitches may extend to a two-dimensional array, as shown in FIG. 5. In this configuration, additional electrical connections may be created between a pair of vertically-stacked wafers by using additional posts fabricated in two dimensions within the "footprint" of a conventional ten-micron-diameter post. As with the configuration of FIG. 4, the pitch along both the x- and y-directions is different for each wafer, providing the arrangement as shown. Again, in the two-dimensional embodiment the posts are disposed in a layout that covers the surface of the wafer in a manner that allows for a CMP process to maintain planarity of the surface.

Summarizing, the use of via arrays configured to exhibit different pitches represents a significant enhancement to the manufacturability of 3D wafer stacks. By implementing a different pitch on each wafer, relatively small diameter posts may be used (addressing the dishing problems associated with larger-sized posts) without requiring complex, expensive bonding tools to provide sub-micron alignment in joining the wafers. That is, as mentioned above, the use of different pitches de-couples the post overlay criteria from the tolerances of a given bonding tool.

Moreover, while the above embodiments have described the use of multiple pitches in the context of a DBI process, it is to be understood that the inventive approach of using multiple pitches is applicable to any arrangement used to provide wafer-to-wafer attachment in a vertical stack. Some of these other arrangements include, but are not limited to, indium bump-to-bond, metal-to-metal diffusion bonding, adhesive bonding, and the like. Also, as mentioned above, although examples have been described in the context of attaching one "wafer" to another, the same techniques may also be used to create a vertical connection between one integrated circuit die (a smaller portion of a wafer) and another die (i.e., die-to-die vertical stack). The same techniques can even be used for wafer-to-die stacking configuration, including configurations where an interposer element is used to provide connections between other wafers or dies in a stack. In general, any type of vertical stacking and interconnection of integrated circuit "substrates" may utilize the multiple pitch topology as described above.

In a typical IC assembly, certain of the small-diameter posts on a given wafer will be designated to make an electrical connection. Those posts will connect to an underlying patterned metal line within the wafer. For example, the footprint of a prior art post (such as posts P1 and P2 shown in FIGS. 4 and 5) may be shifted, in implementations of the new approach described here, to an underlying metal layer.

Other posts in the typical IC assembly will be dummy posts that lie outside of any electrical connection. Those posts are included as fill for the CMP planarization process. That is, a full array of posts is useful for maintaining planarity of the entire planarized region.

Although various embodiments of the present invention have been described in detail, it should be understood that various changes, substitutions and alterations can be made herein without departing from the spirit and scope of the invention as defined by the claims appended hereto. Moreover, the scope of the present invention is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A vertically-stacked integrated circuit assembly, comprising:
    a first integrated circuit substrate including a first plurality of bond posts, with adjacent bond posts separated by a predetermined first pitch $P_{bot}$ and each of the first plurality of bond posts exhibits a diameter $D_1$ less than $P_{bot}$; and
    a second integrated circuit substrate including a second plurality of bond posts, with adjacent bond posts of the second plurality of bond posts separated by a predetermined second pitch $P_{top}$ and each of the second plurality of bond posts exhibits a diameter $D_2$ less than $P_{top}$, wherein $P_{top} \neq P_{bot}$, wherein $P_{top} = P_0/(N+1)$, $P_{bot} = P_0/(N-1)$, wherein $P_0$ is defined as a nominal pitch and N is defined as a pitch factor and is an integer greater than one; wherein $D_1$ and $D_2$ are each no less than $(2P_0/(N^2-1))$, wherein the first integrated circuit substrate and the second integrated circuit substrate are vertically arranged such that at least one of the second plurality of bond posts overlaps at least a portion of at least one of the first plurality of bond posts, and wherein the first integrated circuit substrate and the second integrated circuit substrate are electrically and physically connected between the overlapped portion of the at least one of the first plurality of bond posts and the at least one of the second plurality of bond posts.

2. The vertically-stacked integrated circuit assembly as defined in claim 1, wherein $D_1$ is no greater than one micron.

3. The vertically-stacked integrated circuit assembly as defined in claim 1, wherein $D_1$ is essentially equal to $D_2$.

4. The vertically-stacked integrated circuit assembly as defined in claim 1, wherein $$P_{top} = \left(\frac{N-x}{N+x}\right)P_{bot},$$

wherein x is defined as a pitch step greater than zero and less than N.

5. The vertically-stacked integrated circuit assembly as defined in claim 4, wherein $x=1$.

6. The vertically-stacked integrated circuit assembly as defined in claim 1, wherein the first plurality of bond posts is formed of a conductive material.

7. The vertically-stacked integrated circuit assembly as defined in claim 6, wherein the first plurality of bond posts is formed of a metal.

8. The vertically-stacked integrated circuit assembly as defined in claim 7, wherein the first plurality of bond posts is formed of copper.

9. The vertically-stacked integrated circuit assembly as defined in claim 1, wherein the second plurality of bond posts is formed of a conductive material.

10. The vertically-stacked integrated circuit assembly as defined in claim 9, wherein the second plurality of bond posts is formed of a metal.

11. The vertically-stacked integrated circuit assembly as defined in claim 10, wherein the second plurality of bond posts is formed of copper.

12. The vertically-stacked integrated circuit assembly as defined in claim 1, wherein the first integrated circuit substrate comprises a semiconductor wafer.

13. The vertically-stacked integrated circuit assembly as defined in claim 1, wherein the second integrated circuit substrate comprises an integrated circuit die.

14. The vertically-stacked integrated circuit assembly as defined in claim 1, wherein the first integrated circuit substrate comprises an integrated circuit die.

15. The vertically-stacked integrated circuit assembly as defined in claim 1, wherein the second integrated circuit substrate comprises a semiconductor wafer.

16. The vertically-stacked integrated circuit assembly as defined in claim 1, wherein the first plurality of bond posts and the second plurality of bond posts are disposed as one-dimensional arrays along respective surfaces of the first integrated circuit substrate and the second integrated circuit substrate.

17. The vertically-stacked integrated circuit assembly as defined in claim 1, wherein the first plurality of bond posts and the second plurality of bond posts are disposed as two-dimensional arrays across respective surfaces of the first integrated circuit substrate and the second integrated circuit substrate.

18. A vertically-stacked integrated circuit assembly, comprising:
    a first integrated circuit substrate including a first plurality of bond posts, with adjacent bond posts separated by a predetermined first pitch $P_{bot}$ and each of the first plurality of bond posts exhibits a circumradius $C_1$ less than $P_{bot}$; and a second integrated circuit substrate including a second plurality of bond posts, with adjacent bond posts separated by a predetermined second pitch $P_{top}$ and each of the second plurality of bond posts exhibits a circum-radius $C_2$ less than $P_{top}$;

wherein $P_{top} \neq P_{bot}$;

wherein $P_{top} = P_0/(N+1)$;

wherein $P_{bot} = P_0/(N-1)$;

wherein $C_1$ and $C_2$ are each no less than $(2P_0/(N^2-1))$;

wherein $P_0$ is defined as a nominal pitch and N is defined as a pitch factor and is an integer greater than one;

wherein the first integrated circuit substrate and the second integrated circuit substrate are vertically arranged such that at least one of the second plurality of bond posts overlaps at least a portion of at least one of the first plurality of bond posts, thereby causing the first integrated circuit substrate and the second integrated circuit substrate to be electrically and physically connected.

19. The vertically-stacked integrated circuit assembly as defined in claim 18, wherein $C_1$ is essentially equal to $C_2$.

20. The vertically-stacked integrated circuit assembly as defined in claim 18,
    wherein each of the first plurality of bond posts exhibits a circular shape in a plan view; and
    wherein each of the second plurality of bond posts exhibits a circular shape in the plan view.

21. The vertically-stacked integrated circuit assembly as defined in claim 18,
    wherein each of the first plurality of bond posts exhibits a polygonal shape in a plan view; and
    wherein each of the second plurality of bond posts exhibits a polygonal shape in the plan view.

* * * * *